US009665483B2

(12) United States Patent
Suvakovic et al.

(10) Patent No.: US 9,665,483 B2
(45) Date of Patent: May 30, 2017

(54) METHOD AND APPARATUS FOR BIT-INTERLEAVING

(71) Applicant: Alcatel-Lucent USA Inc., Murray Hill, NJ (US)

(72) Inventors: Dusan Suvakovic, Pleasanton, CA (US); Adrian J. de Lind van Wijngaarden, New Providence, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 466 days.

(21) Appl. No.: 14/042,171

(22) Filed: Sep. 30, 2013

(65) Prior Publication Data

US 2015/0095594 A1   Apr. 2, 2015

Related U.S. Application Data

(60) Provisional application No. 61/884,215, filed on Sep. 30, 2013.

(51) Int. Cl.
*G06F 12/06* (2006.01)
*G06F 3/06* (2006.01)
*H03M 13/27* (2006.01)
*H03M 13/00* (2006.01)

(52) U.S. Cl.
CPC ........ *G06F 12/0607* (2013.01); *G06F 3/0604* (2013.01); *G06F 3/067* (2013.01); *G06F 3/0638* (2013.01); *H03M 13/27* (2013.01); *H03M 13/63* (2013.01)

(58) Field of Classification Search
None
See application file for complete search history.

(56) References Cited

U.S. PATENT DOCUMENTS 7,185,179 B1 *  2/2007  Furusho ................. G06F 12/06
                                                      711/E12.09
7,433,980 B1 * 10/2008  Fischaber ............. G11C 7/1006
                                                       365/189.02

(Continued)

FOREIGN PATENT DOCUMENTS

WO  PCT/US2014/058064        3/2015

OTHER PUBLICATIONS

Dusan Suvakovic et al :"Low energy bit-interleaving downstream protocol for passive optical networks", Online Conference on Green Communications(GREENCOM), 2012 IEEE, IEEEE, Sep. 25, 2012, pp. 26-31, XP032410985, ISBN:978-1-4799-0395-5.*

(Continued)

*Primary Examiner* — Jeffrey M Rutkowski
*Assistant Examiner* — Mehedi Aley
(74) *Attorney, Agent, or Firm* — Stephen J. Wyse (57) ABSTRACT

A manner of processing data for transmission in a data communication network. A node having a main memory and an interleaver is provided. Received data is stored in the main memory and a bandwidth map is prepared. The data is then selectively read out and pre-processed according to the bandwidth map and stored in an interleaver memory. The data is later read out and post-processed before interleaving into a downstream data frame. The pre- and post-processing provide the data in a more efficient form for interleaving.

8 Claims, 6 Drawing Sheets

(56) References Cited

U.S. PATENT DOCUMENTS

| | | | | |
|---|---|---|---|---|
| 2002/0051534 A1* | 5/2002 | Matchett | ............... | H04L 9/0625 380/37 |
| 2005/0050428 A1* | 3/2005 | Urard | .................... | H03M 13/27 714/755 |
| 2010/0211749 A1* | 8/2010 | Van Berkel | ......... | G06F 9/30018 711/154 |
| 2012/0121265 A1* | 5/2012 | Suvakovic | ........... | H04B 10/272 398/66 |
| 2014/0047300 A1* | 2/2014 | Liang | .................. | H03M 13/271 714/766 |

OTHER PUBLICATIONS

Dusan Suvakovic et al: "Low Energy Bit-Interleaving Downstream Protocol for Passive Optical Networks", Online Conference on Green Communications (GREENCOM), 2012 IEEE, IEEE, Sep. 25, 2012 (Sep. 25, 2012), pp. 26-31.

Suvakovic Dusan et al: "A Low-Energy Rate-Adaptive Bit-Interleaved Passive Optical Network", IEEE Journal on Selected Areas in Communications, IEEE Service Center, Piscataway, US, vol. 32, No. 8, Aug. 2014 (Aug. 2014), pp. 1552-1565.

Chow Hungkei et al: "Demonstration of Low-Power Bit-Interleaving TDM PON", 2012 38th European Conference and Exhibition on Optical Communications, OSA, Sep. 16, 2012 (Sep. 16, 2012), pp. 1-3.

Jarvinen T S et al: "Register-Based Multi-Port Perfect Shuffle Networks", Conference Proceedings / ISCAS 2001, The 2001 IEEE International Symposium on Circuits and Systems: May 6-9, 2001, Sydney Convention and Exhibtion Centre, Darling Harbour, Sydney, Australia, IEEE Service Center, Piscataway, NJ, vol. 4, May 6, 2001 (May 6, 2001), pp. 306-309.

\* cited by examiner

METHOD AND APPARATUS FOR BIT-INTERLEAVING

CROSS-REFERENCE TO RELATED APPLICATIONS

The present disclosure is related to and claims priority from U.S. Provisional Patent Application Ser. No. 61/884,215, entitled Bit-Interleaved Passive Optical Network and filed on 30 Sep. 2013, the entire contents of which are incorporated by reference herein.

TECHNICAL FIELD

The present invention relates generally to the field of communication networks, and, more particularly, to a method and apparatus for bit-interleaving data traffic in a communication system.

BACKGROUND

The following abbreviations are herewith defined, at least some of which are referred to within the following description of the state-of-the-art and the present invention.
CPE Customer Premises Equipment
IEEE Institute of Electrical and Electronics Engineers
ITU International Telecommunication Union
MAC Media Access Control
OAM Operation, Administration and Maintenance
PON Passive Optical Network
RAM Random Access Memory
SRAM Static RAM
TDM Time Division Multiplexing One way of increasing the efficiency of data transmission is to bit-interleave traffic. In one bit-interleaved solution, a transmitter sends data frames that include a synch portion, a header portion, and a payload portions. A node receiving the frame may process (only) one or more lanes of the frame. A lane is defined by a rate, meaning every $n^{th}$ bit of the received frame, or portion thereof, and offset—the position of the first bit in that lane. This means that the processing of each lane, once extracted, may be done at slower and often much slower rate than the rate at which the frame was transmitted.

The synch and header portions of the received frame allow the receiver to determine where the frame begins and glean information about where in the payload a given lane or lanes of traffic are located.

The synch and header portions normally have static lanes, that is, the rate and offset do not vary. The payload may have lanes of varying size because a map in the header portion indicates the rate and offset of a given lane within the payload. Lanes that occupy a greater portion of the payload than others are associated with a higher rate.

Bit-interleaving may be beneficial in a number of environments. One is in a system where a transmitting node sends the same data stream to a number of receiving nodes even though the data stream includes data that is meant for only one (or less than all) of the nodes. The recipient node then processes the data stream and uses only the data that was intended for it, discarding the rest. Bit-interleaving allows each receiver to first extract only that data that is intended for it (one or more lanes) before the bulk of the processing is performed. The useful data may then be processed at a much lower rate.

In another environment, a receiver may be the intended recipient of the entire data frame, but is able to separate it into a number of lanes for individual processing by separate circuits, allowing it to control the rate of processing.

In yet another environment, bit-interleaving lanes may be created to allow a receiving node to simply forward certain lanes of data on certain egress ports, perhaps combining it with data lanes from another source but also for forwarding on the respective ports. The packets may have to be processed by the next node or nodes, but not by the "zombie" node that is simply forwarding.

Although the bit-interleaved frames gaining these advantages may be relatively easily mapped, performing the actual interleaving required may be more of a challenge to the point of making it impracticable. The present invention addresses this challenge.

Note that the techniques or schemes described herein as existing, possible, or desirable are presented as background for the present invention, but no admission is made thereby that these techniques and schemes or the need for them were heretofore commercialized or known to others besides the inventors.

SUMMARY

The present invention is a manner of forwarding data traffic (and control messages) in a computer network using a bit-interleaving technique. In one embodiment, the present invention is a method of performing the bit-interleaving using a network node, and in another a network node for performing the interleaving.

In one aspect, the present invention is a method of processing data traffic for forwarding, including storing received data packets in a main memory device, identifying a destination for each packet in memory, determining a bandwidth map for each destination, wherein the bandwidth map assigns to each destination a lane defined by rate and offset, and interleaving the stored data according to the bandwidth map, wherein interleaving comprises reading a plurality of data words from the main memory device and writing the plurality of data words each word into a slice of an interleaver memory, the interleaver memory comprising a plurality of memory slices. The method may also include writing each word into a respective memory slice comprises writing each word into a respective sub-module of the memory slice such that only one word of the plurality of words is written into each sub-module, wherein each memory slice of the plurality of slices comprises a plurality of sub-modules.

In this aspect of the present invention, embodiments may also include writing each byte of the word into a respective memory sub-module comprises writing each word into a row as indicated by the bandwidth map, wherein each memory sub-module comprises a plurality of rows. The row indicated in the bandwidth map is a function of the rate associated with the word. Embodiments may also include, prior to writing each word into a respective memory sub-module, performing a shuffle of the bits of the word. The bit shuffle preferably is at least one perfect out shuffle, and the number of shuffles may be calculated as s perfect out shuffles, where the lane rate associated with the word in the bandwidth map is $1/2^s$. This embodiment also preferably includes performing a word rotation of the words of the plurality of words, where the word rotation is performed subsequent to the word shuffle and prior to writing the words into its respective memory slice. The word rotation may include shifting each word o times, where o is the lane offset associated with the word in the bandwidth map. The method may further include reading a row of memory from the plurality of memory slices, un-rotating the words in the row, and serially selecting bits from each slice for insertion into a frame of data traffic. The method may further comprise transmitting the interleaved data frame.

In another aspect, the present invention provides a network node for performing the operations of the methods described herein.

In yet another aspect, the present invention provides a memory device having stored therein programs instructions that when executed by a processor cause the node to perform the operations of the methods described herein.

Additional aspects of the invention will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF THE DRAWINGS

A more complete understanding of the present invention may be obtained by reference to the following detailed description when taken in conjunction with the accompanying drawings wherein.

DETAILED DESCRIPTION

The present invention is a manner of forwarding data traffic (and control messages) in a computer network using a bit-interleaving technique. In one embodiment, the present invention is a method of performing the bit-interleaving using a network node, and in another a network node for performing the interleaving.

Figure 1:
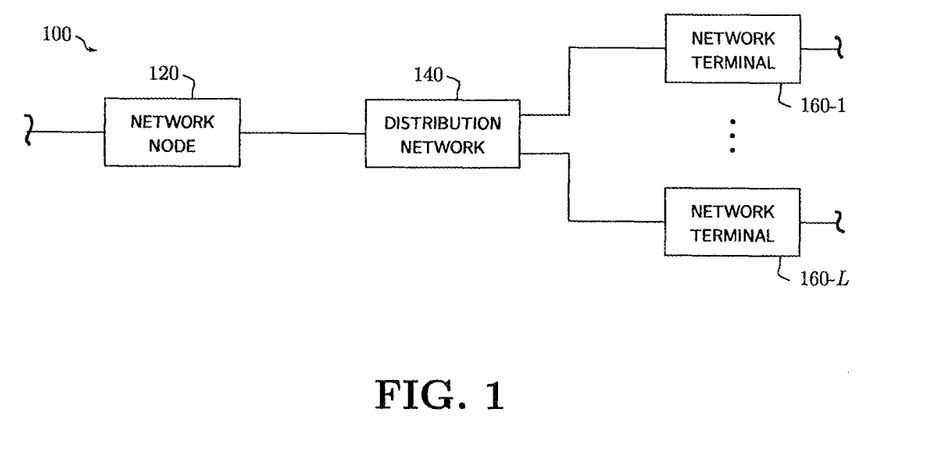
FIG. 1 is a simplified block diagram illustrating selected components of a network configured according to the an embodiment of present invention.

The advantages of the present invention may be exploited in a computer network such as the one shown in FIG. 1. FIG. 1 is a simplified block diagram illustrating selected components of a network 100 configured according to an embodiment of the present invention. In this embodiment, there are a plurality of network terminals 160-1 through 160-L. As the name implies, network terminals 160-1 through 160-L may be at or near the edge of the network and be connected, for example, to user devices (not shown). Although only two network terminals are shown, there may be any number.

In such an arrangement, network node 120 may be a comparatively larger and more powerful device, responsible for handling communications between the network terminals and, for example, a core network (not shown). In this case communications from the core network are received in the network node 120 and forwarded toward the network terminals. Although this may be accomplished by L physical point-to-point connections, in networks such as network 100 at least a portion of these communications are carried over a single channel. This configuration may be the used, for example, for efficiency over long distances.

Communications from network node 120 to the network terminals 160-1 through 160-L may for convenience be referred to as downstream communications. When downstream data traffic, for example, reaches distribution mechanism 140, it is distributed from there to the network terminals via individual communication channels. Note that FIG. 1 is not necessarily to scale; the physical distance between network node 120 and distribution mechanism 140 may in some implementations be much larger than the respective distances between distribution mechanism 140 and the individual network terminals.

In a network such as network 100, the distribution mechanism may in some cases simply forward the communication signals downstream, meaning that each of network terminals receive the signal basically as it was transmitted by network node 120. In other cases, the distribution mechanism may process the signals so that only communications intended for each respective network terminal are forwarded to it.

An exemplary network configured identically or similarly to the network 100 of FIG. 1 is a PON (passive optical network). A PON may be, for example, an access network through which travel communications between an OLT and individual ONU's installed at or near a customer premises. In a PON, downstream optical signals from the OLT are divided using an optical splitter (the distribution mechanism), so that each ONU receives the same data traffic scheme. The recipient ONU then segregates the portion of the data traffic intended for it and discards the remainder.

In any case, some type of protocol is normally implemented to facilitate the downstream communications. Bit-interleaving, described above, is an efficient scheme for transmitting data traffic over such networks. In accordance with the present invention, the network node 120 includes an interleaver module for preparing received traffic for downstream transmission. Either the distribution mechanism 140 or the network terminals 160-1 through 160-L, or both, will correspondingly include what is herein referred to as a decimator for extracting only those bits intended for a particular destination.

In preferred embodiments, the decimation process is performed as early as possible in the reception of the data traffic. This allows downstream data traffic to be transmitted from the network node 120 at a high rate of speed, while a majority of the processing in the receivers may be performed at a much lower rate, and only on data intended for the node processing it.

Note that bit-interleaving may be used for upstream traffic as well, but in many implementations it is more suited to use in only one direction. In a PON, for instance, the upstream transmissions are typically less frequent and smaller than the downstream transmissions, and it may be cost prohibitive for each individual ONU to be configured with the necessary capabilities. The operating environment may be different in other types of networks, of course.

Figure 2:
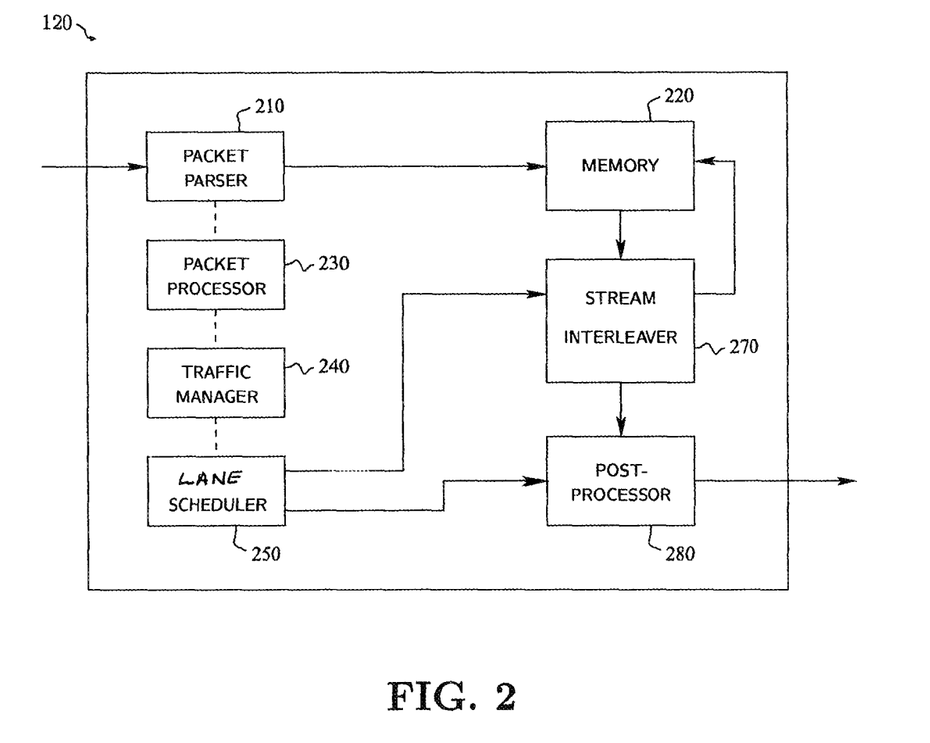
FIG. 2 is a simplified block diagram illustrating selected components of a network node configured according to an embodiment of the present invention.

FIG. 2 is a simplified block diagram illustrating selected components of a network node 120 configured according to an embodiment of the present invention. Note that while network node 120 was presented in FIG. 1 as a component of network 100, it may be implemented in other network configurations as well. In the embodiment of FIG. 2, data traffic enters the node 120 and packet parser 210 and is stored in memory 220. Note that memory 220 is sometimes referred to herein as "main memory". From memory 220 it is read into stream interleaver 270, where it is bit interleaved and passed to post processor 280 where the interleaved data is buffered and prepared for transmission.

When the data traffic arrives, packet processor 230 processes the packets to update header information as necessary and determine the destination. Traffic manager 240 uses the destination information to determine the downstream bandwidth distribution. These and related function performed by packet parser 210, packet processor 230, and traffic manager 240 are largely functions typically performed by, for example, access nodes receiving data traffic for distribution. In accordance with this embodiment of the present invention, lane scheduler 250 converts the bandwidth distribution information from traffic manager 240 into a bandwidth map, where each user or user service is assigned a specific rate and lane offset in a downstream frame.

Control signal paths for this purpose are shown from lane scheduler 250 to stream interleaver 270 and post-processor 280. Control signals from stream interleaver 270 to memory 220 are used to control reading data from memory according to the bandwidth map.

Note that the components may be implemented in hardware, or software running on a hardware device, or a combination of both. In some embodiments, some of the components represented as separate here may be integrated into a single device or divided into more than one.

Figure 3:
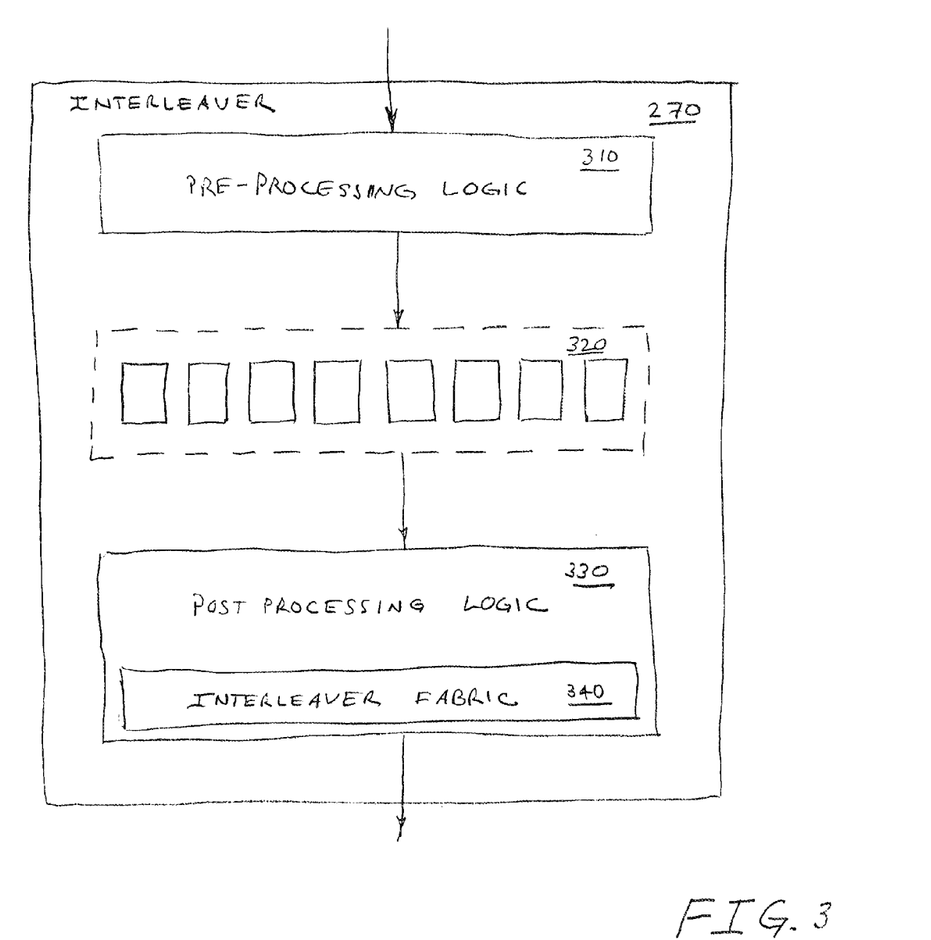
FIG. 3 is a simplified block diagram illustrating selected components of a stream interleaver configured according to an embodiment of the present invention.

FIG. 3 is a simplified block diagram illustrating selected components of a stream interleaver 270 configured according to an embodiment of the present invention. Note that while stream interleaver 270 was presented in FIG. 2 as a component of network node 120, it may be implemented in other configurations as well. In the embodiment of FIG. 3, interleaver 270 includes a memory array 320, which consists of 8 separately addressable memory slices (for clarity, not separately numbered). RAM, and particularly SRAM, is preferably used for the interleaver memory 320. Note that in other embodiments, there may be more or fewer slices in the memory array.

In this embodiment, FIG. 3 also shows the preprocessing logic 310, which processes the data read from the main memory (not shown in FIG. 3) prior to storing it in one of the slices of memory sub-module 320 according to the present invention.

Note the object of pre-processing in this embodiment is to create an arrangement of the bits in the memory 320 that is as close to final as possible, while avoiding having multiple bits contenting to be written over the same RAM column, since such contention would degrade the interleaver 270 throughput by extending the RAM write time to multiple clock cycles.

In the embodiment of FIG. 3, interleaver post-processing logic 330 further processes the data read from memory sub-module 320 before passing the data to interleaver fabric 340. Interleaver fabric 340 completes the interleaving process before the bit-interleaved data is buffered and prepared for transmission, for example by post processor 280 shown in FIG. 2. Interleaver fabric 340 is preferably a hard-wired solution that transfers each bit, now more conveniently arranged into a known order, into its final relative position for transmission in the downstream frame.

Figure 4:
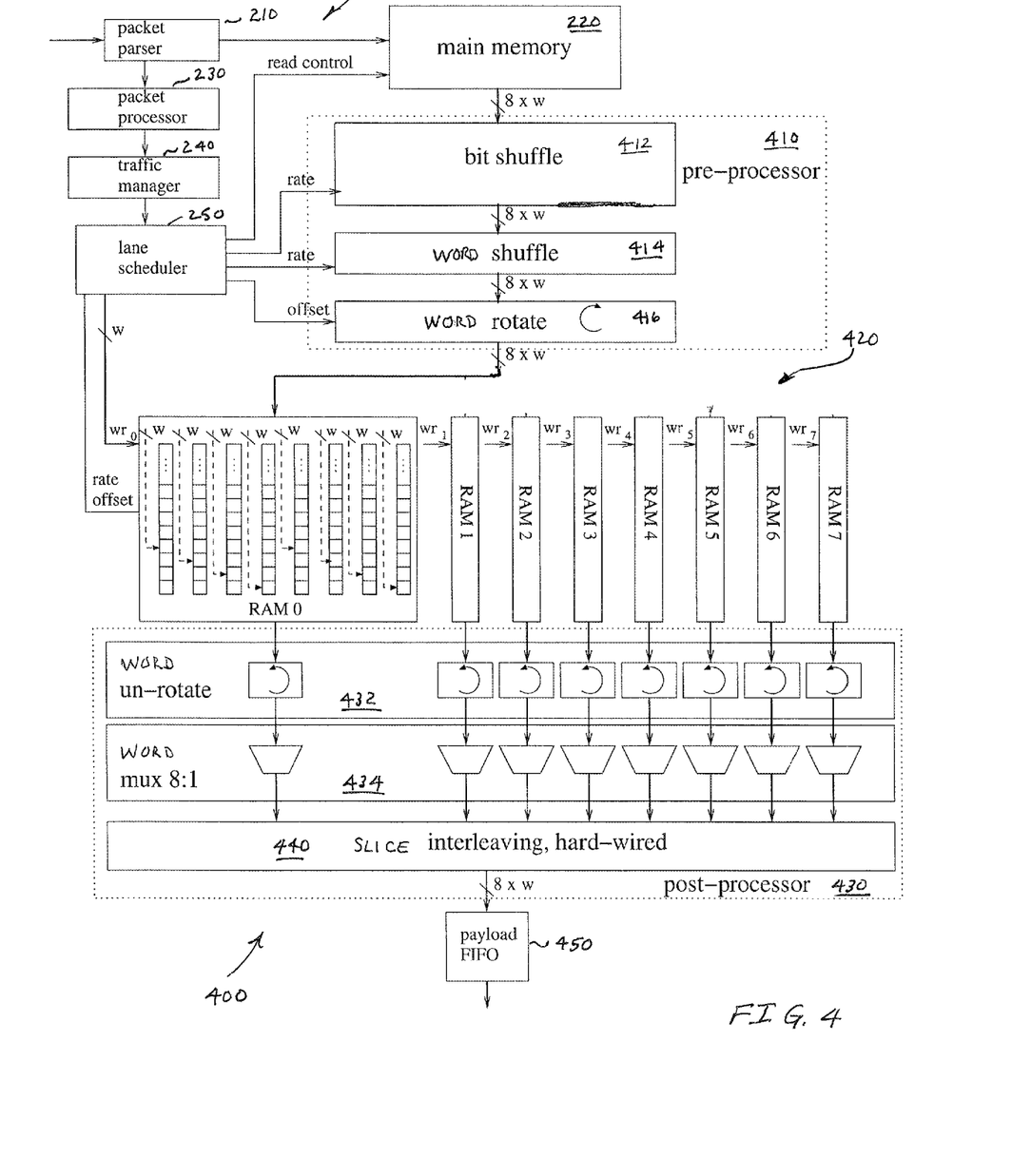
FIG. 4 is a simplified block diagram illustrating selected components of a stream interleaver configured according to an embodiment of the present invention.

The process outlined above will now be described in more detail with reference to FIG. 4. FIG. 4 is a simplified block diagram illustrating selected components of a stream interleaver 400 configured according to an embodiment of the present invention. Stream interleaver 400 is analogous but not necessarily identical to the stream interleaver 270 depicted in FIGS. 2 and 3. Also shown in FIG. 4 are selected components of network node 120 (shown in FIG. 2), referred to accordingly, and a payload FIFO buffer memory 450 for buffering the interleaved output of interleaver 400 as it is passed on for further processing.

In the embodiment of FIG. 4, interleaver memory 420 includes 8 identical memory slices, each having a RAM core (here referred to as RAM 0 through RAM 7) as well as pre-processing and post-processing logic. Each memory slice has 8 separately addressable memory sub-modules, each one word w wide. For convenience these are shown here only for RAM 0. Note that in other embodiments there may be more or fewer memory slices and associated sub-modules.

In FIG. 4, the arrowheads indicate the downstream flow of data traffic, which is read from the main memory 220 as directed from a scheduler 250 (see also, FIG. 2). The 8·w data segment, in most cases corresponding to the width of the data bus (not shown) from the main memory to the interleaver, is read each cycle from the main memory 220.

In this embodiment, the preprocessor 410 is associated with the memory slice including RAM 0. Pre-processor 410 includes a bit shuffle module 412, a word shuffle module 414, and a word rotate module 416. Each slice is provided with a pre-processor analogous to pre-processor 410.

In this embodiment, a data segment is read and directed to one memory slice. There, each word of the incoming data segment is processed by a respective bit-shuffler (not separately shown) of bit shuffle module 412. The bit shuffler shuffles the bits within a single respective word. Each bit-shuffler uses a perfect out shuffle and shuffles the bits a number of times corresponding to the rate associated with lane that the bit of the word will populate.

In this embodiment, after bit shuffle the words of this segment are then themselves shuffled in the same fashion by word-level shuffle module 414, that is, using a perfect out shuffle and a number of shuffles corresponding to the associated lane rate. The words in the segment are then rotated a number of positions according to the offset of the associate lane by word-level rotation module 416.

Note that operation of the bit-shuffle module 412, the word-level shuffle module 414, and the word-level rotation module 416 are controlled by rate and offset information provided by the lane scheduler 250, as indicated in FIG. 4.

In the embodiment of FIG. 4, after the word rotation, each word is read into a respective one of memory sub-modules (here, the sub-modules of RAM 0) in a manner described more fully below. But note here that each word derived from the segment entering this memory slice of interleaver 400 is stored in one sub-module, but not necessarily in the same row as other words in the segment, which are stored in their (other) respective memory sub-modules. In FIG. 4, write arrows to the left of respective sub-modules indicate the location to which the words of the first segment will be written into RAM 0. Later segments for RAM 0 will be similarly stored in other open locations. The process is repeated as each RAM module is filled in similar fashion.

In this embodiment, it will usually take several cycles to either write into each location of a particular row across the memory 420 or determine that a particular location in a given row should be skipped at this time. When a row is fully utilized in this way, it may be read out of memory 420. Note however, that the rows may not always be read out in the order they are filled; in that case, a longer delay before reading out begins will be incurred. Generally speaking, the first rows filled will contain information that will be read out earlier, as it was initially read out of main memory in a particular order for that purpose. When a row has been read out, the memory locations in that row are freed to be written over with later information.

In the embodiment of FIG. 4, when a row of information is read out at the appropriate time, the words read from each RAM core are un-rotated a number of positions according to the row they were read from. As implied in FIG. 4, the rotation is in the opposite direction as that performed by word rotation module 416. This action helps to correctly align each word in the best position for completion of the interleaving process.

In this embodiment, word multiplexer 434 of post processor 430 then repeatedly selects bits from the output of each slice and provides them to slice interleaving module 440. As indicated in FIG. 4, slice interleaving module is preferably hard-wired. The slice interleaving module loads the bits (for example, one word at a time from each slice) into payload buffer 450, from where they will be forwarded for further processing in preparation for downstream transmission.

Figure 5:
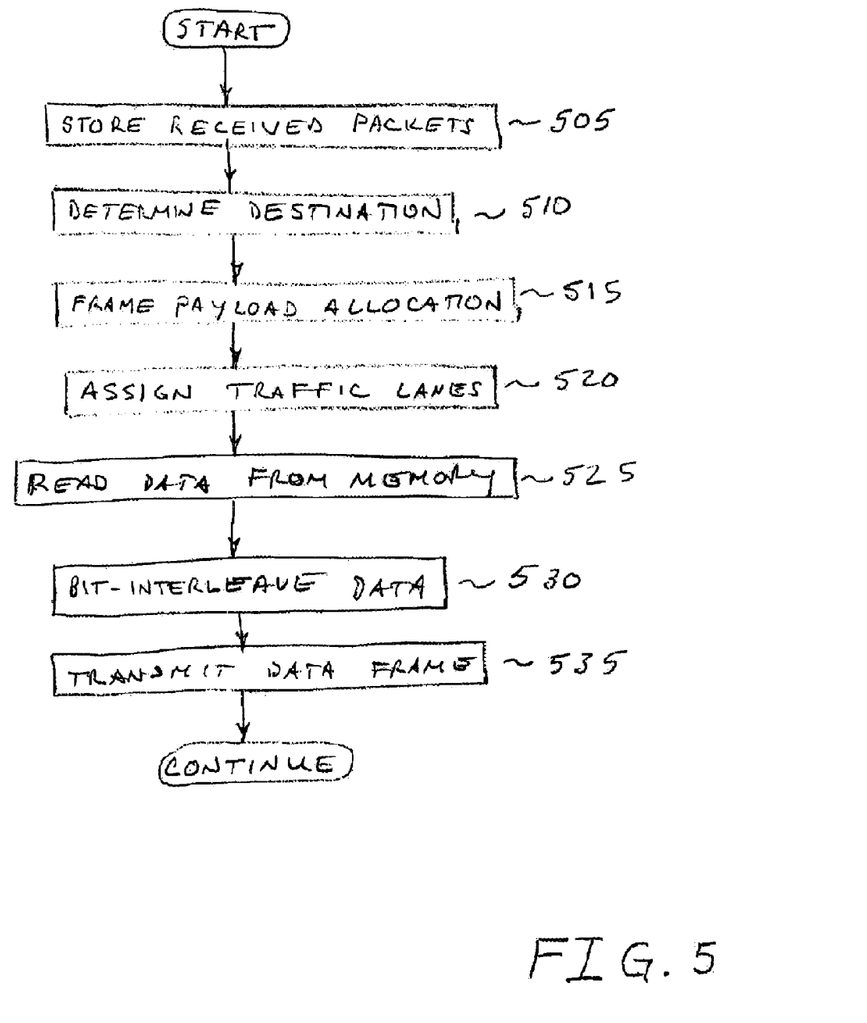
FIG. 5 is a flow diagram illustrating a method according to an embodiment of the present invention.

FIG. 5 is a flow diagram illustrating a method 500 according to an embodiment of the present invention. At START it is presumed that the necessary components are available and operable according to this embodiment. Generally speaking, the method 500 is executed by a properly configured network node and in a preferred embodiment, is implemented in an OLT. The process then begins with the storage (step 505) of received data traffic in a main memory. In an OLT embodiment, for example, this may be traffic from a core network to be forwarded to one or more ONUs via a PON.

In this embodiment, the stored data is processed to determine (step 510) its intended destination. Other processing may of course take place as well. Note that in this context the destination typically refers to a certain device or user, but if the network is one that may treat data traffic associated with different services going to the same or multiple users, "destination" is deemed to encompass that distinction as well.

In accordance with this embodiment of the present invention, a portion of the next frame payload is then assigned (step 515) to traffic intended for this destination. This assignment will usually be based on the amount of traffic for this destination relative to others, but may also take into account priority, quality of service, or other factors as well. In some cases, traffic in main memory for a certain destination may not be assigned a portion of the next frame, but instead assigned a lane in a later frame.

In the embodiment of FIG. 5, a lane is then assigned (step 520) to the traffic for the next frame that is intended for a particular destination. In some cases, if permitted in a particular implementation, multiple lanes may carry traffic for a single destination. As mentioned above a lane is defined, in the bit-interleaving context, by a rate and an offset. The rate indicates how frequently bits for this lane will appear in the frame payload, and the offset indicates the location of the first appearance. The offset will of course vary for each lane, and in accordance with the present invention the rate may vary from lane to lane as well (although within certain defined limits).

In the embodiment of FIG. 5, data is then read (step 525) from the main memory according to the lane assignments (and especially the rate associated with the respective lanes). In other words, data traffic may be read from main memory in a different order than it was received. The data read from main memory is then interleaved (step 530) into a bit-interleaved data frame before it is transmitted (step 535). This process will be more fully explained below in reference to FIG. 6.

Figure 6:
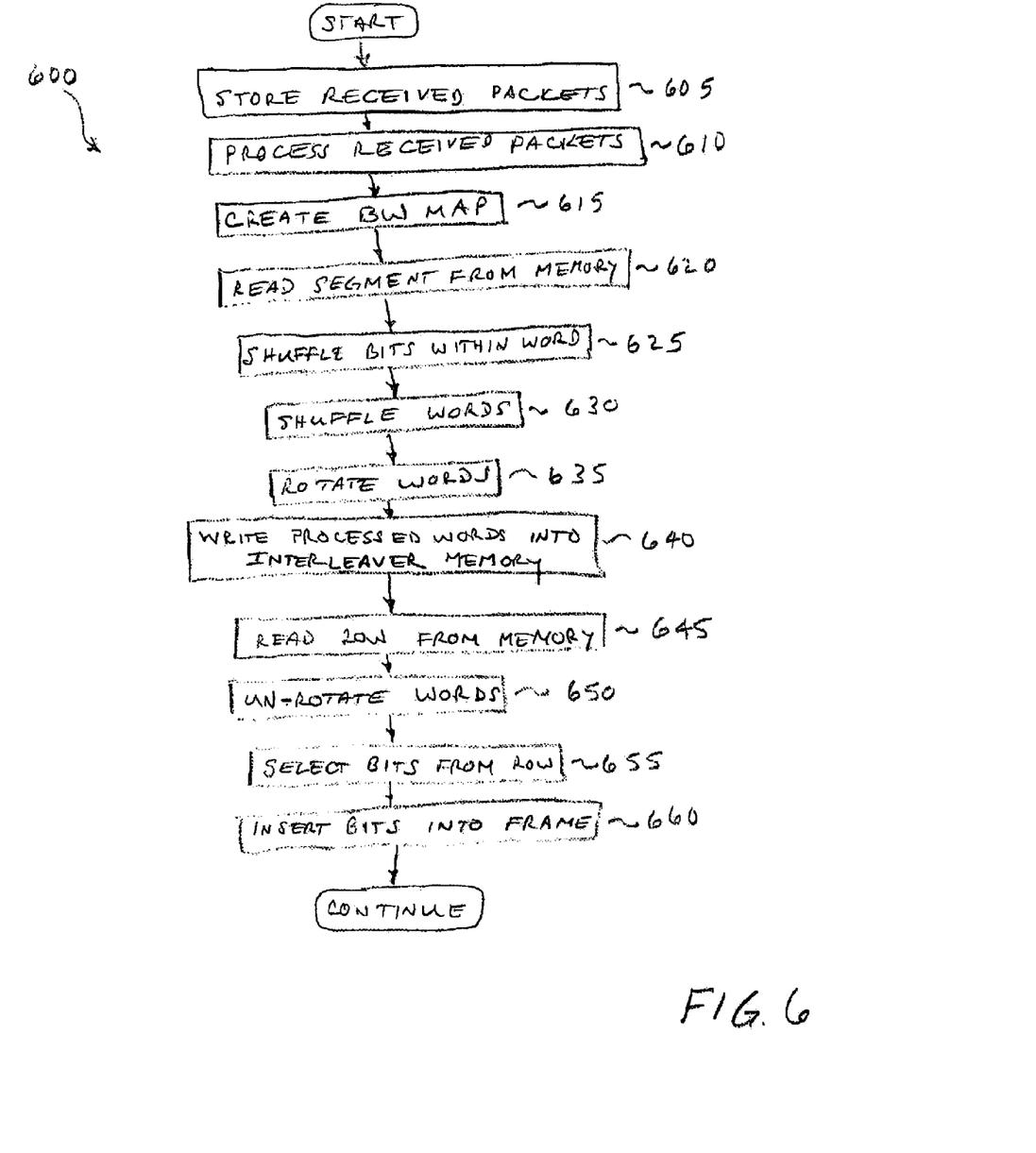
FIG. 6 is a flow diagram illustrating a method according to an embodiment of the present invention.

FIG. 6 is a flow diagram illustrating a method 600 according to another embodiment of the present invention. At START it is presumed that the necessary components are available and operable according to this embodiment. At START it is presumed that the necessary components are available and operable according to this embodiment. Generally speaking, the method 600 is executed by a properly configured network node and in a preferred embodiment, is implemented in an OLT. The process then begins with storing (step 605) received data packets in a memory device. This device is referred to herein as the "main memory" for purposes of clarity.

In this embodiment, packets that are received and stored are processed in the normal fashion as far as determining each packet's destination (step 610) and revising the packet header information as appropriate (not separately shown). A traffic management module determines the amount of data traffic going to each destination so that proper allocation may be made, and a scheduler creates (step 615) a bandwidth map is created. The bandwidth map defines lanes for the data to be bit-interleaved and determines which data will go into each lane. The bandwidth map is used to determine which words of data are read from memory and how they are processed by the various modules of, for example, FIG. 4.

Note that as used herein, a destination, and hence the associated lane, generally refer to one user or user device. In some implementations, however, separate lanes will be assigned to data associated with different services that still go to a single user or end device. The concept of a destination is broad enough to encompass both of these meanings. In other words, it is not relevant here whether a given end device or user is the intended recipient of one lane from a frame or multiple lanes.

In this embodiment, a data segment may then be read (step 620) from the main memory. As used here, a data segment is a number of data words that correspond with data intended for one lane. Words are selected according to the bandwidth map created at step 615. The present invention provides a more efficient interleaving solution than simply sampling from main memory those bits immediately needed for interleaving. The words of the segment read from memory are presented for interleaving (not separately shown).

In the embodiment of FIG. 6, the bits of each word in the segment are then shuffled (step 625) according to the rate associated with the word. As mentioned above, the preferred shuffle is a perfect (out) shuffle. This refers to a rearranging of the bits according to the expression $$C_{ps}=c_0,c_n,c_1,c_{n+1},\ldots c_{n-1},c_{2n-1}$$

where C is a series with 2n members $C=c_0 \ldots c_{2n-1}$. The shuffle of bits within each word is carried out s times during this operation, where the lane rate associated with the word is $1/2^s$. For example, a word associated with a lane having a rate of 1/8 (every $8^{th}$ bit in the interleaved frame payload) would be shuffled 3 times. In a preferred embodiment, this is performed in one clock cycle, as the interleaver is aware of the outcome of three shuffles and directs the incoming bits to an appropriate output accordingly.

In this embodiment, the words in the segment are then shuffled (step 630) in the same fashion, again using a perfect (out) shuffle according to the rate associated with the words in the segment. At this point, the words in the segment are rotated (step 635), one position for each bit that the lane is offset in the frame payload. In a preferred embodiment, the word shuffle and the word rotation are each also accomplished in one clock cycle.

In the embodiment of FIG. 6, it is noted again that there is by design a separately addressable sub-module of memory for each word, with each sub-module being a word in width. (See, for example, FIGS. 3 and 4.) Each sub-module has a number of rows where a word may be stored. After the word rotation of step 635 has been accomplished, the words are written (step 640) to their respective sub-modules, each word being placed in a different sub-module so that all words of the same segment may be written in a single clock cycle.

In this embodiment, the row placement for each word depends on the rate associated with the lane for which the word is intended. In general, adopting a convention where the first word in written in a first column at the bottom row, successive words (as shuffled and rotated) are placed in succeeding sub-module one row up from the previous word, except that depending on the rate, placement may again resume from the bottom. Words associated with the maximum allowed rate are simply placed in locations in the bottom row. Words associated with one-half that rate return to the bottom row every other word, at one-quarter the max rate, every fourth word, and so forth. Sub-modules may be skipped to accommodate much slower rates. The overriding factor is that words from the same segments must each occupy different sub-modules.

In this embodiment, successive segments are written into each of the sub-modules, sometimes including in rows already occupied by a previously written segments (in different locations, of course, at least until a particular row has been read). The interleaver must of course wait until all locations in the row (that are not intentionally skipped) have been filled before the data can be read out. At that point, however, a row is read out (step 645), and the segment is un-rotated (step 650) a number of positions according to the row that the data was read from.

In the embodiment of FIG. 6, the un-rotated words are then presented to a sub-module of multiplexers (see, for example, FIG. 4). Each multiplexer will select (step 655) one bit at a time for insertion (step 660) into the frame. In a preferred embodiment, a wire fabric is used to insert the extracted bits into their proper frame location. In this way, the data traffic previously read into the memory sub-modules is interleaved for transmission. The interleaved traffic may then be sent to a post processor (not shown in FIG. 6) in preparation for transmission.

Note that the sequence of operation illustrated in the drawings represent exemplary embodiments; some variation is possible within the spirit of the invention. For example, additional operations may be added to those shown, and in some implementations one or more of the illustrated operations may be omitted. In addition, the operations of the method may be performed in any logically-consistent order unless a definite sequence is recited in a particular embodiment.

Although multiple embodiments of the present invention have been illustrated in the accompanying Drawings and described in the foregoing Detailed Description, it should be understood that the present invention is not limited to the disclosed embodiments, but is capable of numerous rearrangements, modifications and substitutions without departing from the invention as set forth and defined by the following claims.

The invention claimed is:

1. A method of processing data traffic for forwarding, comprising:
   storing received data packets in a main memory device in an OLT (optical line terminal) of a PON (passive optical network);
   identifying a ONU (optical network unit) destination for each packet in memory; determining a bandwidth map for each destination, wherein the bandwidth map assigns to each destination a lane defined by rate and offset;
   interleaving the stored data according to the bandwidth map, wherein interleaving comprises reading a plurality of data words from the main memory device and writing the plurality of data words into a slice of an interleaver memory, the interleaver memory comprising a plurality of memory slices; wherein each memory slice of the plurality of slices comprises a plurality of sub-modules and wherein writing each word into a memory slice comprises writing each word of the plurality of words into a respective sub-module of the memory slice such that only one word of the plurality of words is written into each sub-module; and
   prior to writing each word into a respective memory sub-module, performing a shuffle of the bits of the word, wherein the bit shuffle comprises at least one perfect out shuffle;
   where the bit shuffle comprises s perfect out shuffles, where the lane rate associated with the word in the bandwidth map is $1/2^s$.

2. The method of claim 1, wherein each memory sub-module comprises a plurality of rows, and wherein writing each byte of the word into a respective memory sub-module comprises writing each word into a row as indicated by the bandwidth map.

3. The method of claim 1, wherein the row indicated in the bandwidth map is a function of the rate associated with the word.

4. The method of claim 1, further comprising performing a word rotation of the words of the plurality of words.

5. The method of claim 4, wherein the word rotation comprises shifting each word o times, where o is the lane offset associated with the word in the bandwidth map.

6. The method of claim 1, further comprising, prior to writing each word into a respective memory sub-module, performing a shuffle of the words of the plurality of data words.

7. The method of claim 6, wherein the word rotation is performed subsequent to the word shuffle and prior to writing the plurality of words into its respective memory slice.

8. The method of claim 1, further comprising transmitting the interleaved data.

* * * * *